United States Patent [19]

Shibata et al.

[11] Patent Number: 5,754,838

[45] Date of Patent: May 19, 1998

[54] SYNCHRONOUS DYNAMIC MEMORY DEVICE CAPABLE OF OPERATING OVER WIDE RANGE OF OPERATION FREQUENCIES

[75] Inventors: Ken Shibata, Tachikawa; Kanji Oishi, Koganei, both of Japan

[73] Assignees: Hitachi, Ltd., Tokyo; Hitachi Device Engineering Co., Ltd., Chiba, both of Japan

[21] Appl. No.: 576,491

[22] Filed: Dec. 21, 1995

[30] Foreign Application Priority Data

Dec. 27, 1994 [JP] Japan .................... 6-337975

[51] Int. Cl.[6] .................................................. G06F 1/08
[52] U.S. Cl. .................... 395/559; 395/556; 395/432
[58] Field of Search ........................... 395/494, 552, 395/556, 559, 431, 432; 365/194, 233

[56] References Cited

U.S. PATENT DOCUMENTS

| 4,239,991 | 12/1980 | Hong et al. | 327/172 |
|---|---|---|---|
| 4,644,184 | 2/1987 | Miyawaki et al. | 365/194 X |
| 4,985,868 | 1/1991 | Nakano et al. | 365/233 X |
| 5,623,638 | 4/1997 | Andrade | 395/494 |

OTHER PUBLICATIONS

"HM5216800, HM5416800 Series Data Book" published by Hitachi, Ltd., Jan. 18, 1993, pp. 1-36.

*Primary Examiner*—Thomas M. Heckler
*Attorney, Agent, or Firm*—Antonelli, Terry, Stout, & Kraus, LLP

[57] ABSTRACT

In a synchronous DRAM, internal clock signals in synchronism with clock signals fed from an external unit are generated by a PLL circuit or a DLL circuit to eliminate signal delays. In order to provide a dynamic RAM that is capable of stably operating with clock signals over a wide range of frequencies; a change-over circuit is provided which changes the range of variable frequencies of the PLL circuit or changes the variable delay time of the DLL circuit based upon mode-setting information fed from an external unit.

5 Claims, 11 Drawing Sheets

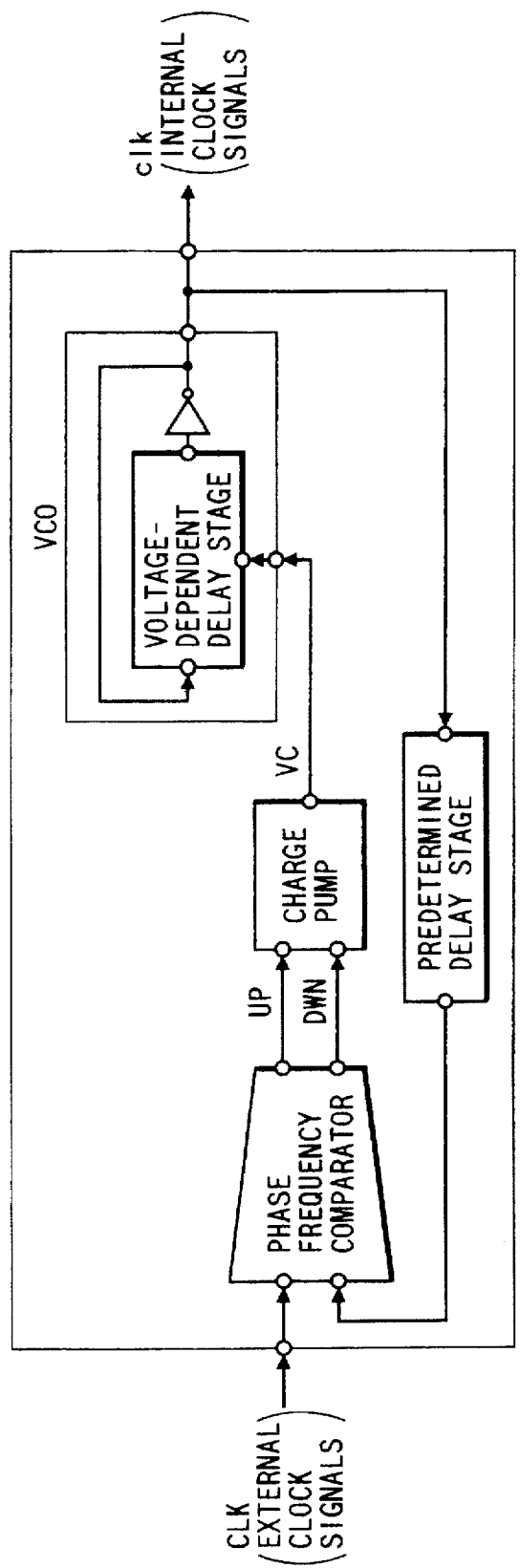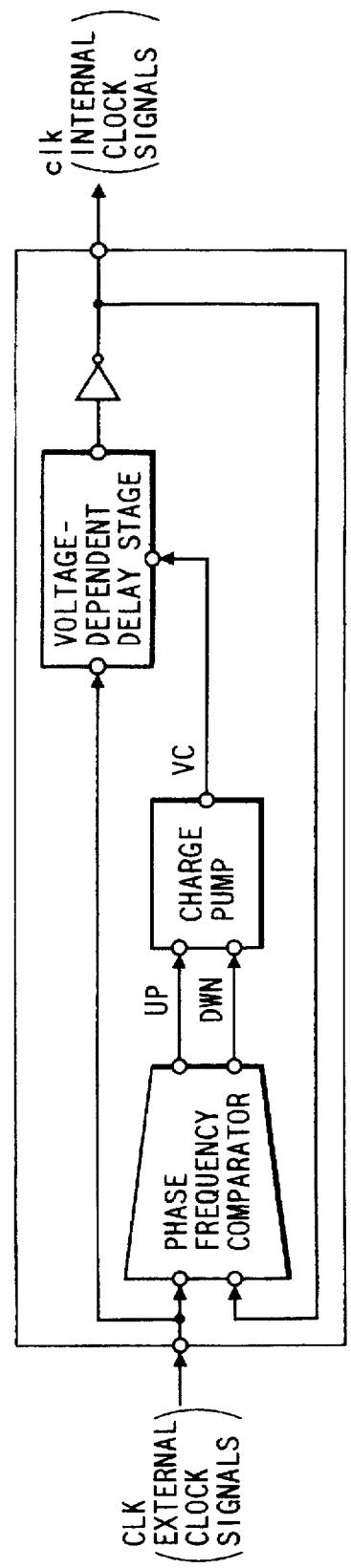

FIG. 11

| ADDRESS | MODE |
|---|---|
| A0 | BURST LENGTH |
| A1 | |
| A2 | |
| A3 | BURST TYPE |
| A4 | CAS LATENCY |
| A5 | |
| A6 | |
| A7 | 0 |
| A8 | RESERVED |
| A9 | |
| A10 | |
| A11 | |

| A6 | A5 | A4 | CAS LATENCY | OPERATION FREQUENCY |
|---|---|---|---|---|
| 0 | 0 | 1 | 1 | 30~50MHz |
| 0 | 1 | 0 | 2 | 50~100MHz |
| 0 | 1 | 1 | 3 | 100~150MHz |

| A9 | A8 | OPERATION FREQUENCY |
|---|---|---|
| 0 | 0 | 50~100MHz |
| 0 | 1 | 100~200MHz |
| 1 | 0 | 200~300MHz |
| 1 | 1 | ...... |

SYNCHRONOUS DYNAMIC MEMORY DEVICE CAPABLE OF OPERATING OVER WIDE RANGE OF OPERATION FREQUENCIES

BACKGROUND OF THE INVENTION

The present invention relates to a dynamic RAM (random access memory)(dynamic memory device) and, particularly, to a technology that can be effectively utilized for a synchronous DRAM (dynamic RAM) in/from which data are written/read in synchronism with clock signals fed through an external terminal.

The synchronous DRAM has been described in, for example, "HM5216800, HM5416800 Series Data Book" published by Hitachi, Ltd., Jan. 18, 1993, etc.

SUMMARY OF THE INVENTION

With the development in the technology for producing semiconductor integrated circuits, synchronous DRAMs have been improved in operation speed. In correspondence with the high speed operation of internal circuits the frequency of clock signals has been increased. As the frequency of the clock signals increases, however, delay in the signals is no longer negligible in the input buffer constituted by a MOS circuit. The present inventors therefore have contrived to generate internal clock signals necessary for operating the synchronous DRAM circuit in an internal circuit utilizing a known PLL (phase locked loop) circuit or a DLL (delay locked loop) circuit. This makes it possible to substantially eliminate delay in the signals in the input buffer, or to form internal clock signals in synchronism with the external system clock signals by temporarily dividing, as required, the frequency of the clock signals fed from an external unit to obtain clock signals of a low frequency, which are then input to a synchronous DRAM where the frequency is returned back again to the initial high frequency through the internal PLL circuit.

However, the user of the synchronous DRAM operates the DRAM at the operation frequency conforming to the system in which the DRAM is incorporated. That is, no matter how fast the synchronous DRAM may operate, if the performance of the information processing system such as a microcomputer in which the DRAM is provided is low, the DRAM must be operated correspondingly to the low performance. In this case, when the operation speed is lower than the upper-limit operation frequency, the synchronous DRAM may sufficiently operate correspondingly thereto. When the internal clock signals are formed by using a PLL circuit or a DLL circuit, however, limitation is practically imposed on the operation frequency since the variable operation frequency in the PLL circuit is low and the variable delay time in the DLL circuit is relatively short. Therefore, in order to form the internal clock signals using a PLL circuit or a DLL circuit, plural kinds of DRAMs meeting various operation speeds such as low speed, intermediate speed and high speed must be prepared, making it necessary to develop products corresponding thereto and to manage the products. This creates a problem of marring the mass-productivity.

The object of the present invention is to provide a dynamic RAM which is capable of stably operating over a wide range of frequencies. The above and other objects as well as novel features of the present invention will become obvious from the description of the specification and the accompanying drawings.

A representative example of the inventions disclosed in this application will be briefly described below. That is, a synchronous DRAM is provided in which internal clock signals are formed by a PLL circuit or a DLL circuit in synchronism with the clock signals fed from an external unit, and wherein the DRAM includes a change-over circuit which changes the range of variable frequencies of the PLL circuit or changes the variable delay time of the DLL circuit based upon mode-setting data fed from an external unit.

According to the above-mentioned means in which the internal clock signals are formed by the PLL circuit or the DLL circuit, synchronism with the external clock signals is stably maintained even at high frequencies, and a wide range of operation frequencies down to a low operation frequency can be realized by changing over the range of operation.

BRIEF DESCRIPTION OF THE DRAWINGS

FIG. 3 is a circuit diagram illustrating a PLL circuit for generating internal clock signals of the synchronous DRAM according to the embodiment;

FIG. 4 is a circuit diagram illustrating a DLL circuit for forming internal clock signals of the synchronous DRAM according to the embodiment;

FIG. 11 is a diagram illustrating the address set by a mode register and the operation mode according to the embodiment;

DESCRIPTION OF THE PREFERRED EMBODIMENTS

Figure 1:
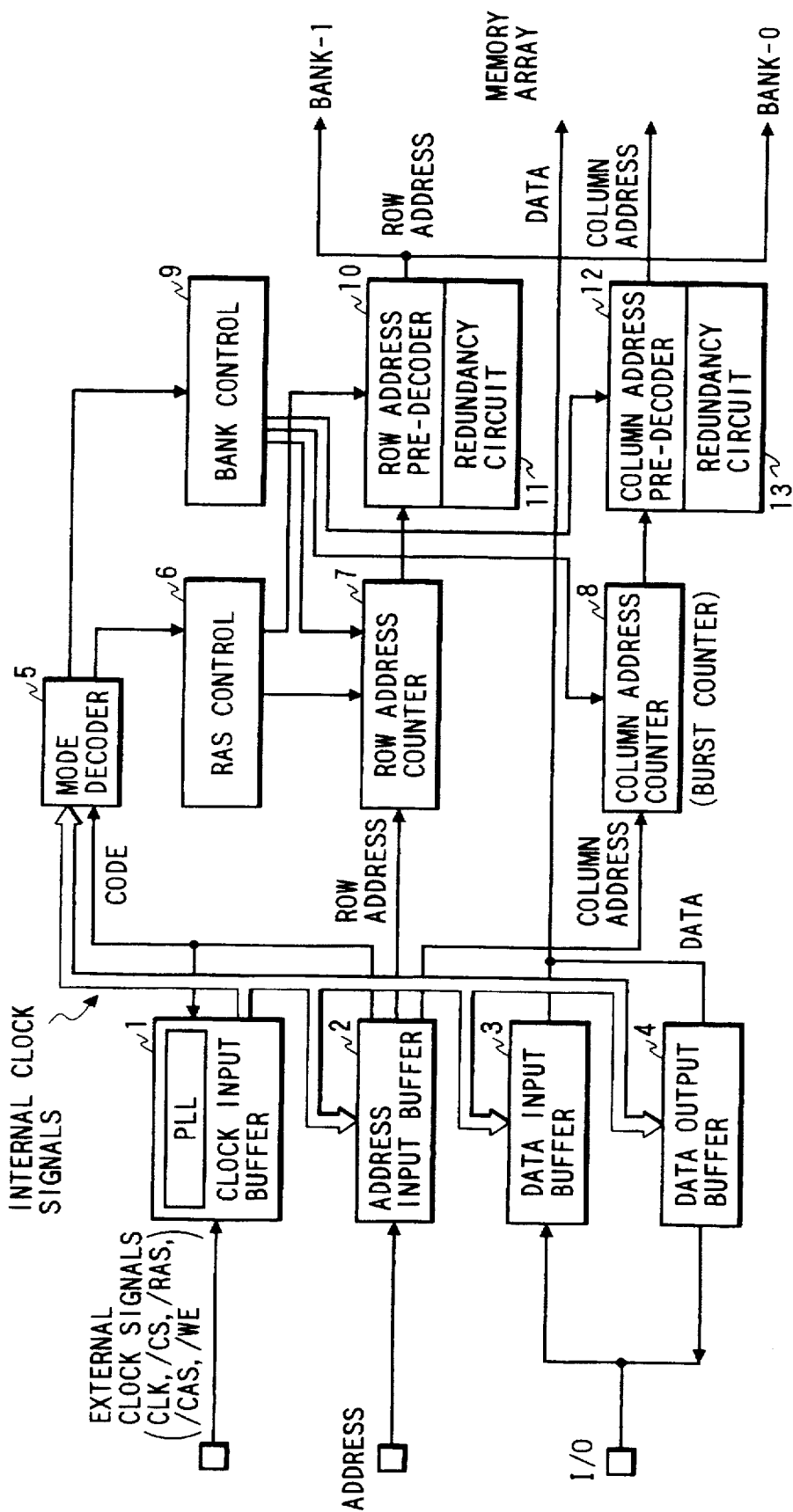
FIG. 1 is a block diagram illustrating a major portion of a dynamic RAM (synchronous DRAM) according to an embodiment of the present invention.

FIG. 1 is a block diagram illustrating a major portion of a dynamic RAM (synchronous DRAM) according to an embodiment of the present invention, i.e., representatively exemplifying an input/output buffer and an internal circuit associated therewith in the synchronous DRAM.

A clock input buffer 1 generates a variety of control signals necessary for the internal operation upon receiving control signals such as chip select signal /CS, row address strobe signal /RAS, column address strobe signal /CAS and write enable signal /WE in addition to external clock signals CLK. Unlike the conventional synchronous DRAM, the external clock signals CLK are not used as they are as internal clock signals but, instead, the internal clock signals are generated by a PLL circuit included in the clock input buffer 1.

That is, the external clock signals CLK are input to the phase comparator in the PLL circuit and are compared with the internal clock signals, whereby the phase (frequency) of the internal clock signals are controlled according to the external clock signals CLK, and internal clock signals in synchronism with the external clock signals are generated. Compared with the conventional circuit in which the external clock signals CLK are used as they are as internal clock signals, the above-mentioned constitution makes it possible to substantially eliminate the delay in the signals in the input buffer and is adaptable to the external clock signals CLK of a high frequency to a sufficient degree.

An address input buffer 2 receives address signals that are input in time series as will be described later. In addition to row address signals and column address signals, the code data for setting the mode is received through the address input buffer 2. The code data is set to a mode register included in a mode decoder 5 and is decoded by the mode decoder 5, and a control signal is generated to realize the operation corresponding thereto.

A data input buffer 3 receives write signals fed from an input/output terminal I/O and transmits them as write data to a memory array that is not diagramed. A data output buffer 4 sends the data read out from the memory array to an external unit through an external terminal I/O.

According to the output from the mode decoder 5, a RAS control circuit 6 controls a row address counter 7 and a row address predecoder 10, and controls the operation of selecting the row address. The row address signal is input as an initial value to the row address counter 7. The row address predecoder 10 decodes the address signal and sends an address signal (row address') that is predecoded to banks 0 and 1 (bank-0, bank-1).

According to the output signal from the mode decoder 5, a bank control circuit 9 controls a column address counter 8 and a column address predecoder 12, and controls the operation of selecting the row address. The column address signal is input as an initial value to the column address counter 8. The column address counter 8 is also termed burst counter. The column address predecoder 12 decodes the address signal and sends a predecoded address signal (column address') to the memory array.

The row address predecoder 10 is provided with a redundancy circuit 11 so that a defective word line can be replaced by a redundancy word line. Similarly, the column address predecoder 12 is provided with a redundancy circuit 13 so that a defective data line can be replaced by a redundancy data line.

Figure 2:
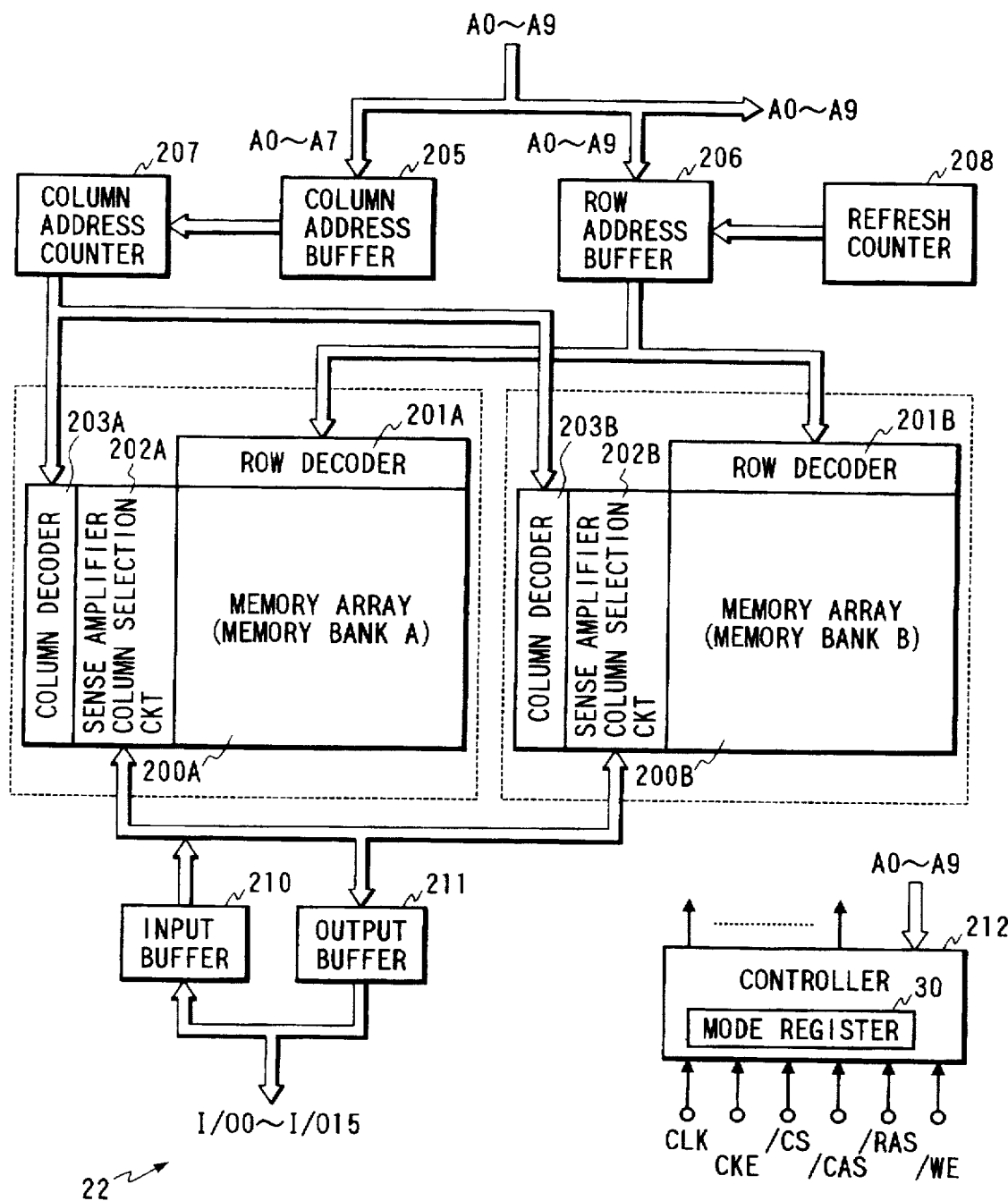
FIG. 2 is a block diagram illustrating a synchronous DRAM according to the embodiment of the present invention.

FIG. 2 is a block diagram illustrating the above-mentioned synchronous DRAM (hereinafter simply referred to as SDRAM) according to an embodiment. Though there is no particular limitation, the SDRAM that is shown is formed on a semiconductor substrate such as of single crystalline silicon by a known technique of fabricating a semiconductor integrated circuit. For easy comprehension of the whole circuit of the synchronous DRAM, the circuit blocks of FIG. 2 which are the same as those of FIG. 1 are denoted by different numerals for the overall consistency.

The SDRAM of this embodiment comprises a memory array 200A constituting a memory bank A and a memory array 200B constituting a memory bank B. The memory arrays 200A and 200B are each equipped with dynamic memory cells arranged in a matrix. Referring to FIG. 2, the selection terminals of the memory cells arranged in the same column are coupled to a word line (not shown) of each column, and the data input/output terminals of the memory cells arranged in the same row are connected to complementary data lines (not shown) of each row.

One of the word lines of the memory array 200A is energized to a selection level according to the result of decoding row address signal by a row decoder 201A. The complementary data lines of the memory array 200A are coupled to a sense amplifier and to a column selection circuit 202A. The sense amplifier and a sense amplifier in the column selection circuit 202A detect a very small potential difference appearing on the complementary data lines and amplify it depending upon the data read out from a memory cell. A column switching circuit is provided for selecting the complementary data lines for electrically connecting selected data line to common complementary data lines 204. The column switching circuit is selectively operated according to the result of the decoding of the column address signal by a column decoder 203A.

Similarly, the memory array 200B is provided with a row decoder 201B, a sense amplifier, a column selection circuit 202B and a column decoder 203B. The common complementary data lines 204 are connected to the output terminal of an input buffer 210 and to the input terminal of an output buffer 211. The input terminal of the input buffer 210 and the output terminal of the output buffer 211 are connected to 16-bit data input/output terminals I/O 0 to I/O 15.

The row address signals and column address signals fed from address input terminals A0 to A9 are received by the column address buffer 205 and the row address buffer 206 in an address multiplex form. The address signals that are fed are held by the respective buffers. In a refresh operation mode, the row address buffer 206 receives, as a row address signal, a refresh address signal output from a refresh counter 208. The output of the column address buffer 205 is fed as preset data of the column address counter 207, which outputs to the column decoders 203A, 203B the column address signal which is the preset data or values obtained by sequentially increasing the column address signal according to the operation mode designated by a command that will be described later.

Though there is no particular limitation, a controller 212 receives external control signals such as clock signals CLK, clock enable signals CKE, chip select signals /CS, column address strobe signals /CAS (signal symbols marked with / are row enable signals), row address strobe signals /RAS and write enable signals /WE, as well as control data from the address input terminals A0 to A9. Based upon changes in the levels of signals and timings, the controller 212 forms an internal timing signal for controlling the operation mode of the SDRAM and the operation of the above-mentioned circuit blocks. For this purpose, the controller 212 is provided with a control logic (not shown) and a mode register 30.

As described earlier, the clock signals CLK are input to the phase comparator in the PLL circuit (or DLL circuit) and are used for maintaining synchronism with the internal clock signals that are formed therein. The internal clock signals formed by the PLL circuit are used as master clock signals of the SDRAM, and other signals input from external units are significantly used in synchronism with the rising edge of the internal clock signals. The chip select signal /CS of the low level commands the start of command input cycle. When the chip select signal /CS is at the high level (when the chip is not selected), other inputs have no meaning. Here, however, the state of selecting the memory bank that will be described later and internal operation such as the burst operation, are not affected by a change into the state that no chip is selected. The signals such as /RAS, /CAS and /WE have functions different from the corresponding signals in the ordinary DRAM, and serve as significant signals for defining the command cycle that will be described later.

The clock enable signal CKE designates the validity of the next clock signal; i.e., the rising edge of the next clock signal CLK is validated when the clock enable signal CKE is at the high level and is ineffective when it is at the low level. Moreover, in the read mode, though not diagramed, the controller 212 is also fed with an external control signal which controls the output enable for the output buffer 211. When the external control signal is, for example, at the high level, the output buffer 211 is changed to a high-output-impedance state.

The row address signal is defined by the levels A0 to A8 in the row address strobe bank active command cycle that will be described later and that is in synchronism with the rising edge of the clock signal CLK (internal clock signal).

The input from A9 is regarded as a bank selection signal in the above-mentioned row address strobe bank active command cycle. That is, the memory bank A is selected when the input of A9 is at the low level, and the memory bank B is selected when it is at the high level. Though there is no particular limitation, selection of the memory bank can be controlled by activating only the row decoder on the selected memory bank side, by selecting none of the column switching circuits on the non-selected memory bank side, or by making connection to the input buffer 210 and to the output buffer 211 only on the selected memory bank side.

The input of A8 in a precharge command cycle that will be described later designates the mode of precharge operation for the complementary data lines; i.e., the input of A8 of the high level designates that the objects to be precharged are the two memory banks and the input of A9 of the low level designates that either of the memory banks should be precharged.

The column address signal is defined by the levels A0 to A7 in a read or write command (column address read command, or column address write command that will be described later) cycle that is in synchronism with the rising edge of the clock signal CLK (internal clock). The thus defined column address is used as a start address for the burst access.

Major operation modes in the SDRAM designated by commands will be described below.

(1) Mode register set command (Mo)

This is a command for setting the mode register 30. The command is designated by /CS, /RAS, /CAS, /WE=low level, and the data (register set data) to be set is given via A0 to A9. Though there is no particular limitation, the register set data may be a burst length, a CAS latency or a write mode. Though there is no particular limitation, the burst length that can be set is 1, 2, 4, 8 or full-page (256), the CAS latency that can be set is 1, 2 or 3, and the write mode that can be set is a burst write or a single write.

In the reading operation designated by a column address read command that will be described later, the CAS latency designates how many cycles of internal clock signals are to be taken from the fall of a /CAS signal to the output operation of the output buffer 211. The internal operation time for reading the data is necessary before the read data is defined, and is set according to the frequency of the internal clock signals. In other words, the CAS latency is set to a relatively large value when internal clock signals of a high frequency are used, and is set to a relatively small value when internal clock signals of a low frequency are used.

(2) Row address strobe bank active command (Ac)

This is a command for effecting the designation of row address strobe and the selection of memory bank, and is designated by /CS, /RAS=low level, /CAS, /WE=high level. In this case, the address to be fed to A0 to A8 is received as a row address signal, and the signal to be fed to A9 is received as a memory bank selection signal. The reception of the signals is carried out in synchronism with the rising edge of the internal clock signals as described above. For example, when this command is designated, a word line in a memory bank designated by this command is selected, and a memory cell connected to the word line is electrically connected to the corresponding complementary data lines.

(3) Column address read command (Re)

This command is necessary for starting the burst read operation and for giving designating of the column address strobe, and is designated by /CS, /CAS=low level and /RAS, /WE=high level. In this case, the column address to be fed to A0 to A7 is received as a column address signal. The column address signal that has been thus received is fed to the column address counter 207 as a burst start address. In the burst read operation designated thereby, a memory bank and a word line therein have been selected in the preceding row address strobe bank active command cycle. Therefore, the memory cells of the selected word line are successively selected and are consecutively read out according to address signals output from the column address counter 207 in synchronism with the internal clock signals. The number of data consecutively read out is equal to the number designated by the burst length. Reading the data from the output buffer 211 is started after having waited for a number of cycles of internal clock signals defined by the CAS latency.

(4) Column address write command (Wr)

A burst write that is set in the mode register 30 as a mode of writing operation is used as a command that is necessary for starting the burst writing operation, and a single write that is set in the mode register 30 as a mode of writing operation is used as a command that is necessary for starting the single writing operation. The command further gives designation of the column address strobe in the single write and in the burst write. The command is designated by /CS, /CAS, /WE=low level and /RAS=high level. At this moment, the address fed to A0 to A7 is received as a column address signal. The column address signal that is received is fed as a burst start address to the column address counter 207 in the burst write. The burst writing operation designated thereby is carried out in the same procedure as that of the burst reading operation. In the writing operation, however, there is no CAS latency, and reception of write data is started from the column address write command cycle.

(5) Precharge command (Pr)

This is a command for starting the precharging operation for a memory bank that is selected by A8 and A9, and is designated by /CS, /RAS, /WE=low level and /CAS=high level.

(6) Automatic refresh command

This is a command necessary for starting the automatic refreshing, and is designated by /CS, /RAS, /CAS=low level and /WE, CKE=high level.

(7) Burst stop in full-page command

This is a command necessary for halting the burst operation for full-page for all memory banks, and is disregarded in the burst operation other than for full-page. This command is designated by /CS, /WE=low level and /RAS, /CAS=high level.

(8) No-operation command (Nop)

This is a command for designating that no operation is substantially carried out, and is designated by /CS=low level and /RAS, CAS, /WE=high level.

In the SDRAM, when one memory performs a burst operation, the other memory bank is designated during the operation and the row address strobe bank active command is fed, the row address operation is carried out in one memory bank without affecting the operation in the other memory bank. For instance, the SDRAM has means for holding the data, addresses and control signals fed from an external unit. Here, though there is no particular limitation, the contents such as addresses and control signals are held in each memory bank. Alternatively, the data of one word line in a memory block selected by the row address strobe bank active command cycle are latched by a latch circuit that is not shown to execute the reading operation prior to the column operation.

Therefore, unless the data collide at the data input/output terminals I/O 0 to I/O 15, it is possible to start the internal operation beforehand by issuing a precharge command and a row address strobe bank active command to the memory bank which is different from the memory bank in which a command is not finished and is being executed.

The SDRAM 22 can receive and output data, addresses and control signals in synchronism with the clock signals CLK (internal clock signals) and hence it is capable of operating a memory having a capacity as large as a DRAM at a speed as fast as that of the SRAM. By designating how many data are to be accessed for a word line that is selected using a burst length, furthermore, the SDRAM 22 successively changes over the state of selecting the columns using an incorporated column address counter 207, enabling a plurality of data to be successively read out or written.

FIG. 3 is a diagram illustrating the PLL circuit that constitutes the clock signal input circuit according to the embodiment, wherein an external clock signal CLK input through the clock input buffer is fed to either of the inputs of a phase frequency comparator (hereinafter simply referred to as phase comparator). An internal clock signal clk formed in a voltage-controlled oscillation circuit (hereinafter simply referred to as VCO) is fed to the other input of the phase comparator via a predetermined delay means. The phase comparator compares the phases (frequencies) of the above-mentioned clock signal CLK and the internal clock signal clk, and forms an up signal UP and a down signal DWN corresponding to the phase difference.

The up signal UP and the down signal DWN formed by the phase comparator are input to a charge pump circuit which electrically charges the capacitor correspondingly to the pulse width (phase difference) of the up signal UP to raise the control voltage VC and discharges the capacitor correspondingly to the pulse width (phase difference) of the down signal DWN to lower the control voltage VC. That is, the charge pump circuit constitutes a loop filter which integrates the above-mentioned up signals UP or the down signals DWN to convert them into a direct current.

The VCO is constituted by a ring oscillator in which voltage-dependent delay means are annularly connected in cascade, and the delay times of the delay means are controlled by the control signal VC. The oscillation frequency of the VCO is determined according to the inverse ratio of the delay times; i.e., the VCO operates as a voltage-controlled oscillation circuit. That is, when the phase (frequency) of the internal clock signal clk is delayed (has a lower frequency than) behind the external clock signal CLK, the phase comparator forms an up signal UP that corresponds to the phase difference, and consequently the charge pump circuit raises the control voltage VC. As the control voltage VC is raised, the delay time in the voltage-dependent delay means is shortened, whereby the phase of the internal clock signal clk is advanced (the frequency is increased) and synchronized with the external clock signal CLK.

Conversely, when the phase (frequency) of the internal clock signal clk is preceding the external clock signal CLK (the frequency is higher), the phase comparator forms a down signal DWN that corresponds to the phase difference, and hence the charge pump circuit lowers the control voltage VC. As the control voltage VC is lowered, the delay times of the voltage-dependent delay means are lengthened and the phase of the internal clock signal clk is delayed (the frequency is decreased) so as to be synchronized with the external clock signal CLK.

In this embodiment, though there is no particular limitation, the phase comparator compares the external clock signal CLK that has passed through the input buffer with the internal clock signal clk that has passed through the predetermined delay means. By providing the predetermined delay means and by permitting it to be in agreement with the signal transmission delay time of the input buffer, it is possible to completely synchronize the clock signal CLK fed to the external terminal into with the internal clock signal clk generated in the internal circuit. In the synchronous DRAM of this embodiment, therefore, the operation is carried out at a high frequency corresponding to the upper-limit operation frequency of the internal circuit thereof without paying attention to the signal delay in the input buffer that receives the clock signals.

FIG. 4 is a diagram illustrating the DLL circuit that constitutes the clock signal input circuit according to the embodiment, wherein an external clock signal CLK input through the clock input buffer is fed to either of the inputs of a phase frequency comparator (hereinafter simply referred to as phase comparator) and is further fed to a voltage-dependent delay stage. A lagged internal clock signal clk formed by the voltage-dependent delay means is fed to the other input of the phase comparator. The phase comparator compares the phases (frequencies) of the above-mentioned clock signal CLK with the internal clock signal clk, and forms an up signal UP and a down signal DWN corresponding to the phase difference. Here, a circuit made up of the phase frequency comparator and the clock input buffer may be defined as a phase frequency comparator. In this case, the phase frequency comparator receives external clock signals input from a unit outside the chip.

The up signal UP and the down signal DWN formed by the phase comparator are input to a charge pump circuit which is similar to the one mentioned above. The charge pump circuit electrically charges the capacitor correspondingly to the pulse width (phase difference) of the up signal UP to raise the control voltage VC and discharges the capacitor corresponding to the pulse width (phase difference) of the down signal DWN to lower the control voltage VC.

The delay time of the voltage-dependent delay means is controlled by the control signal VC. That is, the internal clock signal clk is the one having the same frequency as the external clock signal CLK but lagged by one period behind the external clock signal CLK by the voltage-dependent delay means. When the phase of the internal clock signal clk is lagged behind the external clock signal CLK, the phase comparator forms an up signal UP that corresponds to the phase difference, and accordingly the charge pump circuit raises the control voltage VC. As the control voltage VC is raised, the delay time in the voltage-dependent delay means is shortened, whereby the phase of the internal clock signal clk is advanced to be synchronized with the external clock signal CLK.

Conversely, when the phase of the internal clock signal clk is preceding the external clock signal CLK, the phase comparator forms a down signal DWN that corresponds to the phase difference, and hence the charge pump circuit lowers the control voltage VC. As the control voltage VC is lowered, the delay times of the voltage-dependent delay means are lengthened and the phase of the internal clock signal clk is lagged so as to be synchronized with the external clock signal CLK.

When the signal delay at the input buffer which receives the external clock signals CLK is a problem, the internal clock signal clk may be lagged and input to the phase comparator through the predetermined delay stage that corresponds to the signal propagation delay time of the input buffer like in the embodiment of FIG. 3. This makes it possible to synchronize the clock signals CLK fed to the external terminal with the internal clock signals clk generated in the internal circuit in the same manner as described above.

Figure 5:
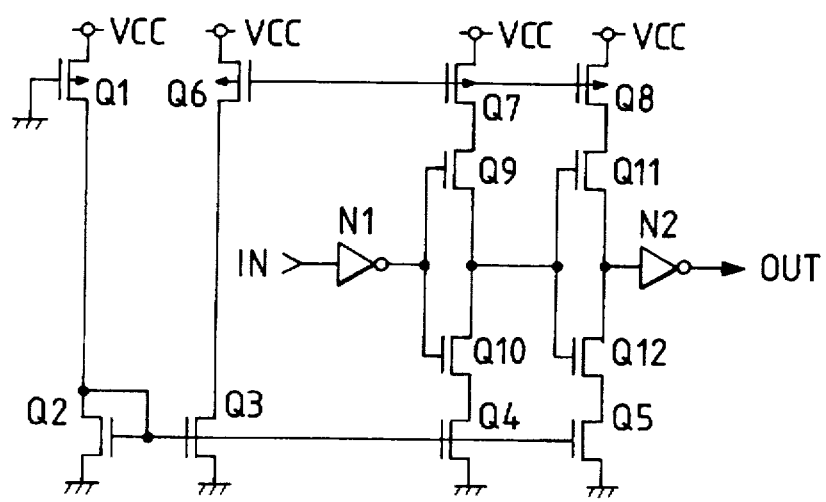
FIG. 5 is a circuit diagram illustrating a predetermined delay stage of FIG. 3 according to the embodiment.

FIG. 5 is a circuit diagram of the predetermined delay means (delay circuit) according to the embodiment. An electric current formed by a p-channel MOSFET Q1 of which the gate is steadily connected to ground potential of the circuit, is permitted to flow through an n-channel MOSFET Q2 of the form of a diode. N-type MOSFETs Q4 and Q5 are provided in the form of a current mirror with respect to the MOSFET Q2, and are connected in series with n-channel MOSFETs Q10 and Q12 that constitute a CMOS inverter circuit. The current formed by the MOSFET Q1 is caused to flow through a p-channel MOSFET Q6 in the form of a diode through the n-channel MOSFET Q3 connected in the form of a current mirror with respect to the MOSFET Q2. There are provided p-channel MOSFETs Q7 and Q8 in the form of a current mirror with respect to the MOSFET Q6 and the p-channel MOSFETs Q7 and Q8 are connected in series with p-channel MOSFETs Q9 and Q11 that constitute a CMOS inverter circuit.

The CMOS inverter circuit constituted by the p-channel MOSFET Q9, n-channel MOSFET Q10, p-channel MOSFET Q11 and n-channel MOSFET Q12, forms an output current that corresponds to the current formed by the MOSFET Q1. Thus, a signal delay time is determined correspondingly to the output current. Though there is no particular limitation in this embodiment, an input signal IN is fed to CMOS inverter circuits Q9, Q10 of the input stage through an inverter circuit N1, and the output signal of the CMOS inverter circuits Q11, Q12 of the output stage is output as an output signal OUT through an inverter circuit N2.

Figure 6:
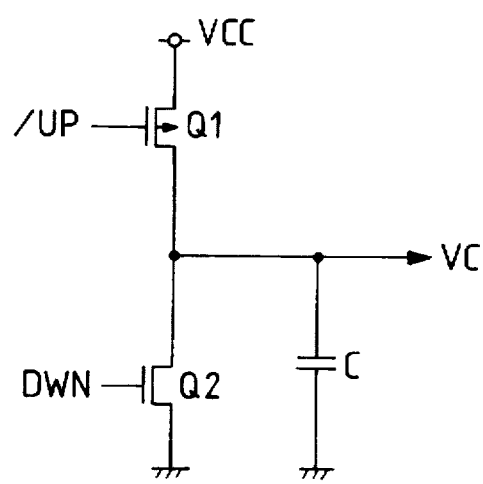
FIG. 6 is a diagram of a charge pump circuit used in a PLL circuit or a DLL circuit according to the embodiment.

FIG. 6 is a diagram illustrating a charge pump circuit according to an embodiment constituted by a p-channel MOSFET Q1 for receiving an up signal /UP, an n-channel MOSFET Q2 for receiving a down signal DWN, and a capacitor C which is electrically charged and discharged through these MOSFETs Q1 and Q2. The p-channel MOSFET Q1 is turned on by the up signal /UP of the low level, whereby the capacitor C is electrically charged to raise the control voltage VC. Conversely, the n-channel MOSFET Q2 is turned on by the down signal DWN of the high level, whereby the capacitor C is discharged to lower the control voltage.

In order to eliminate the dependence of the above-mentioned charge pump circuit upon the power source, it is desirable to provide a constant-current source between the p-channel MOSFET Q1 and the power source voltage VCC so that the charging current becomes constant per unit time and to provide a constant-current source between the n-channel MOSFET Q2 and the ground potential of the circuit so that the discharging current becomes constant per unit time.

Figure 7:
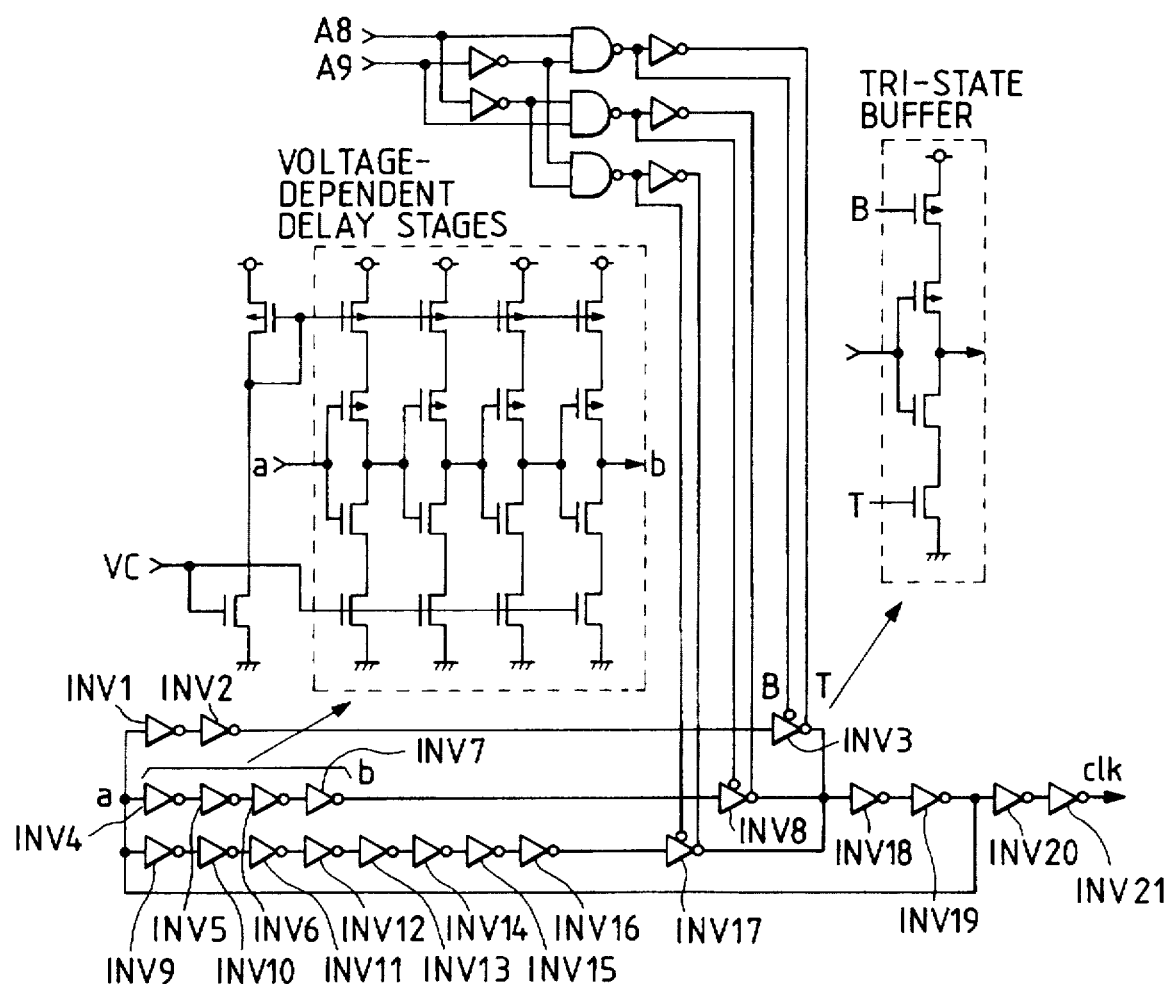
FIG. 7 is a circuit diagram illustrating a ring oscillator used for the PLL circuit of FIG. 3 according to the embodiment.

FIG. 7 is a circuit diagram of the ring oscillator VCO (oscillation circuit) used in the PLL circuit of FIG. 3 according to an embodiment. The VCO has a relatively narrow range of variable frequencies and, hence, the PLL circuit has a relatively narrow range of operation frequencies. In the VCO constituted by the ring oscillator, if the center frequency is set to be, for example, around 100 MHz, then, the oscillation frequency can be varied in a small range of from about 160 MHz to about 50 MHz.

In the currently-available SDRAM, the ranges of the operation frequencies are a range from 30 to 50 MHz, a range from 50 to 100 MHz and a range from 100 to 150 MHz correspondingly to three sorts of CAS latencies. Considering the worst case in even the currently-available SDRAM, therefore, the operation of the PLL circuit may be unstable at its lowest operation frequency such as about 30 MHz when it is attempted to stably operate at 150 MHz or, conversely, at its highest operation frequency such as 150 MHz when it is attempted to stably operate at about 30 MHz. Over the range of operation frequencies such as from 30 MHz to 150 MHz mentioned above, there does not occur any serious problem even when the clock signals fed through the external terminal are used as they are as internal clock signals through the input buffer, using neither the PLL circuit nor the DLL circuit.

With the development in the technology for producing semiconductor integrated circuits, however, it is possible in the near future to increase the operation frequency up to a maximum of about 300 MHz. When the device is operated at such a high frequency, however, the signal delay in the input buffer becomes no longer negligible and it becomes necessary to use the above-mentioned PLL circuit or the DLL circuit. To adapt SDRAMs to the applications or to the existing systems, however, it is convenient for the user to use the SDRAMs capable of operating at about 300 MHz at such low frequencies as about 30 MHz or 50 MHz.

The internal circuit has a sufficient time margin in its operation and operates to a sufficient degree even at such low frequencies as about 30 MHz or 50 MHz. When the internal clock signals are formed by the PLL circuit or by the DLL circuit, however, it is necessary that the range of variable frequencies or the variable delay times of the PLL circuit and the DLL circuit must be so broad as to meet the above-mentioned range of from 30 MHz to 300 MHz. It is, however, difficult to realize a ring oscillator having such a broad range of operation frequencies.

Since there exists the above-mentioned limit to the range of variable frequencies of the ring oscillator varied by the control voltage, the number of stages of the inverter circuits (delay circuits) constituting the ring oscillator according to this embodiment is changed in order to substantially broaden the range of operation frequencies. In this embodiment, though there is no particular limitation, the operation frequency is changed over to one of three ranges.

That is, there are provided a two-stage inverter circuit, a four stage inverter circuit and an eight-stage inverter circuit for changing over the number of stages. FIG. 7 representatively exemplifies a voltage-dependent delay stage made up of four-stage inverter circuit, in which four CMOS inverter are connected in cascade. To the n-channel MOSFETs and p-channel MOSFETs in these CMOS inverter circuits are connected n-channel MOSFETs and p-channel MOSFETs in series through which operation currents are made to flow in the same manner as described above with reference to FIG. 5. What is different from the predetermined delay stage of FIG. 5 is that the control voltage VC is fed to the gate of the n-channel MOSFET through which the operation current is made to flow so that voltage/current conversion operation is carried out. The control voltage VC is converted into a current signal through the n-channel MOSFET and the current signal is fed to the p-channel MOSFET in the form of a diode. The p-channel MOSFET and the p-channel MOSFET through which the operation current is made to flow are connected in the form of a current mirror. Thus, the operation currents of the four-stage CMOS converter circuits are changed with the control voltage VC, so as to perform the operation of the voltage-dependent delay stage. That is, by changing the control voltage VC, the frequency of the ring oscillator that is shown in FIG. 7 can be changed. In other words, the frequency of the ring oscillator increases with an increase in the control voltage VC.

A feedback signal is fed in common to the input a of the two-stage inverter circuit, four-stage inverter circuit and eight-stage inverter circuit. One of the output signals of the two-stage, four-stage, and eight-stage inverter circuits is selected via a tri-state buffer which is an output selection circuit, and is fed back via a three-stage inverter circuit which are similar to those described above. The internal clock signals clk (oscillation signals) are output through two inverter circuits which are waveform-shaping circuits.

Inverters INV1, INV2, INV3, INV18 and INV19 constitute a first group of inverters, inverters INV4 to INV8, INV18 and INV19 constitute a second group of inverters, and inverters INV9 to INV19 constitute a third group of inverters.

The first group of inverters are selected when the frequency of clock signals fed through the external terminal or of external clock signals that respond to the clock signals fed through the external terminal lies within a first range (e.g., 300 to 200 MHz), the second group of inverters are selected when the above frequency lies within a second range (e.g., 200 to 100 MHz), and the third group of inverters are selected when the above frequency lies within a third range (e.g., 100 to 50 MHz). That is, one of the first, second or third inverter group is operated according to the frequency of the external clock signals to constitute an oscillation passage.

Here, the inverters INV18 and INV19 may be omitted.

Though there is no particular limitation, one of the above-mentioned three tri-state buffers is activated by a logic circuit that receives address signals A8 and A9, and the other two are placed in the high-output-impedance state. In a tri-state buffer which is representatively shown, a p-channel MOSFET and an n-channel MOSFET are connected in series with a p-channel MOSFET and an n-channel MOSFET that constitute a CMOS inverter circuit, and control signals B and T are fed thereto. When the control signal B changes to the low level and the control signal T changes to the high level, the p-channel MOSFET and the n-channel MOSFET are turned on, and the operation of the CMOS inverter circuit is made effective to form an output signal. When the control signal B changes to the high level and the control signal T changes to the low level, the p-channel MOSFET and the n-channel MOSFET are turned off, and the CMOS inverter circuit has a high-output-impedance state.

When the address signal A8 is at the high level and the address signal A9 is at the low level, the tri-state buffer provided at the output of the two-stage inverter circuit is operated to output the shortest delay signal, establishing a range of high variable frequencies such as from 300 MHz to 200 MHz. When the address signal A8 is at the low level and the address signal A9 is at the high level, the tri-state buffer provided at the output of the four-stage inverter circuit is operated to output an intermediate delay signal, establishing a range of intermediate variable frequencies such as from 200 MHz to 100 MHz. When both the address signals A8 and A9 are at the low level, the tri-state buffer provided at the output of the eight-stage inverter circuit is operated to output the longest-delay signal, establishing a range of low variable frequencies such as from 100 MHz to 50 MHz.

The address signals A8 and A9 are stored in a mode register that will be described later and are designated from the external unit by issuing a command. Moreover, the operation frequency changes depending upon the CAS latency. It is therefore convenient if the range of variable frequencies of the PLL circuit (DLL circuit) is, at the same time, set automatically according to the set mode of the CAS latency.

Figure 8:
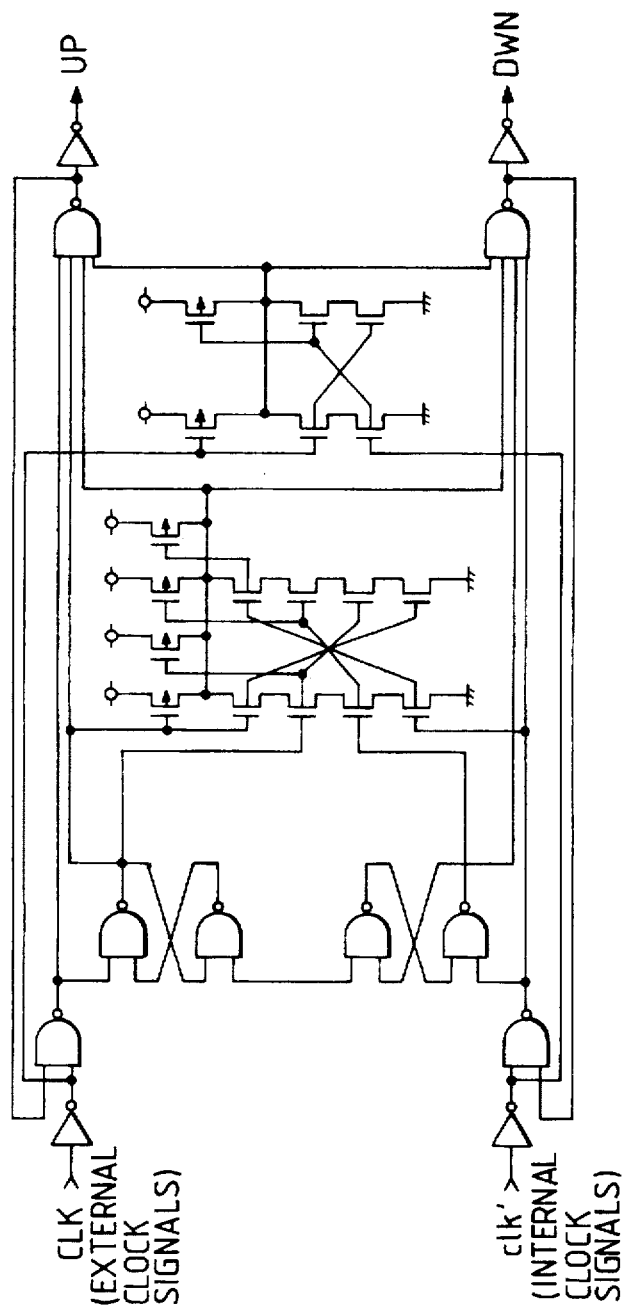
FIG. 8 is a circuit diagram illustrating a phase comparator used for the PLL circuit or the DLL circuit according to the embodiment.
Figure 9:
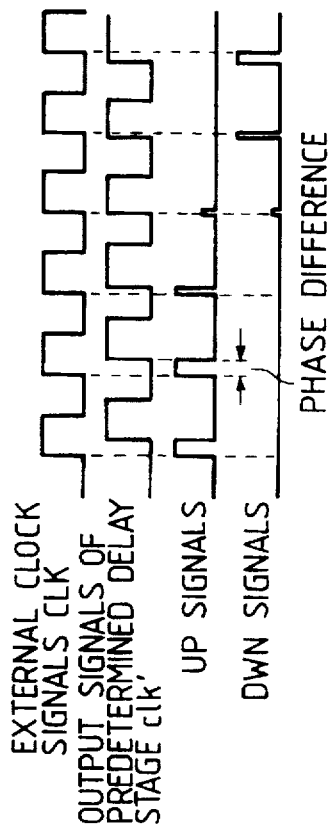
FIG. 9 is a timing chart for explaining the operation of the phase comparator.

FIG. 8 is a circuit diagram of the phase comparator used for the PLL circuit or the DLL circuit according to an embodiment. Though there is no particular limitation, the phase comparator (comparator circuit) is constituted by an inverter circuit, a logic circuit and a composite logic gate circuit as shown, and forms an up signal UP or a down signal DWN (detection signal) having a pulse width corresponding to the phase difference between the two clock signals CLK and clk, as shown in the timing chart of FIG. 9. That is, the phase comparator detects the difference between the timing at which the clock signal CLK changes and the timing at which the clock signal clk changes, and outputs a detection signal UP or DWN that corresponds to the above difference in the timing of change.

Figure 10:
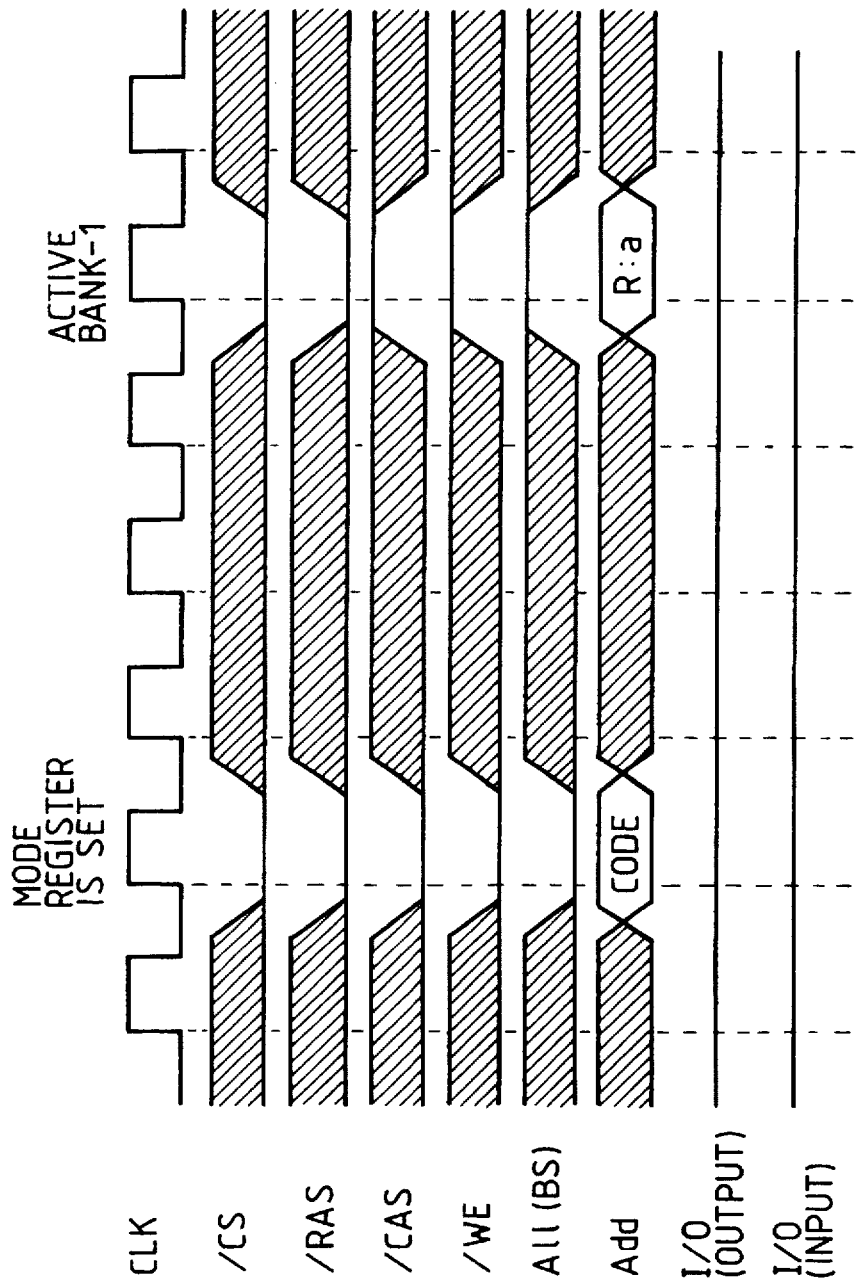
FIG. 10 is a timing chart for explaining the operation of setting the mode register.

FIG. 10 is a diagram of set timings of the mode register. The mode register set command is designated by the signals /CS, /RAS, /CAS, /WE of the low level, and the data (register set data) to be set is given via A0 to A11. Referring to FIG. 11, four different burst lengths (1, 2, 4, 8) of the register set data are designated by 3 bits of the addresses A0 to A2, two different burst types (sequential and interleave) of the register set data are designated by the address A3, and the CAS latency is designated by 3 bits of the addresses A4 to A6. Among the addresses A8 to A11 that are preliminarily provided for the future use, the addresses A9 and A9 designate the range of operation frequencies of the PLL circuit (or the DLL circuit).

Figure 12:
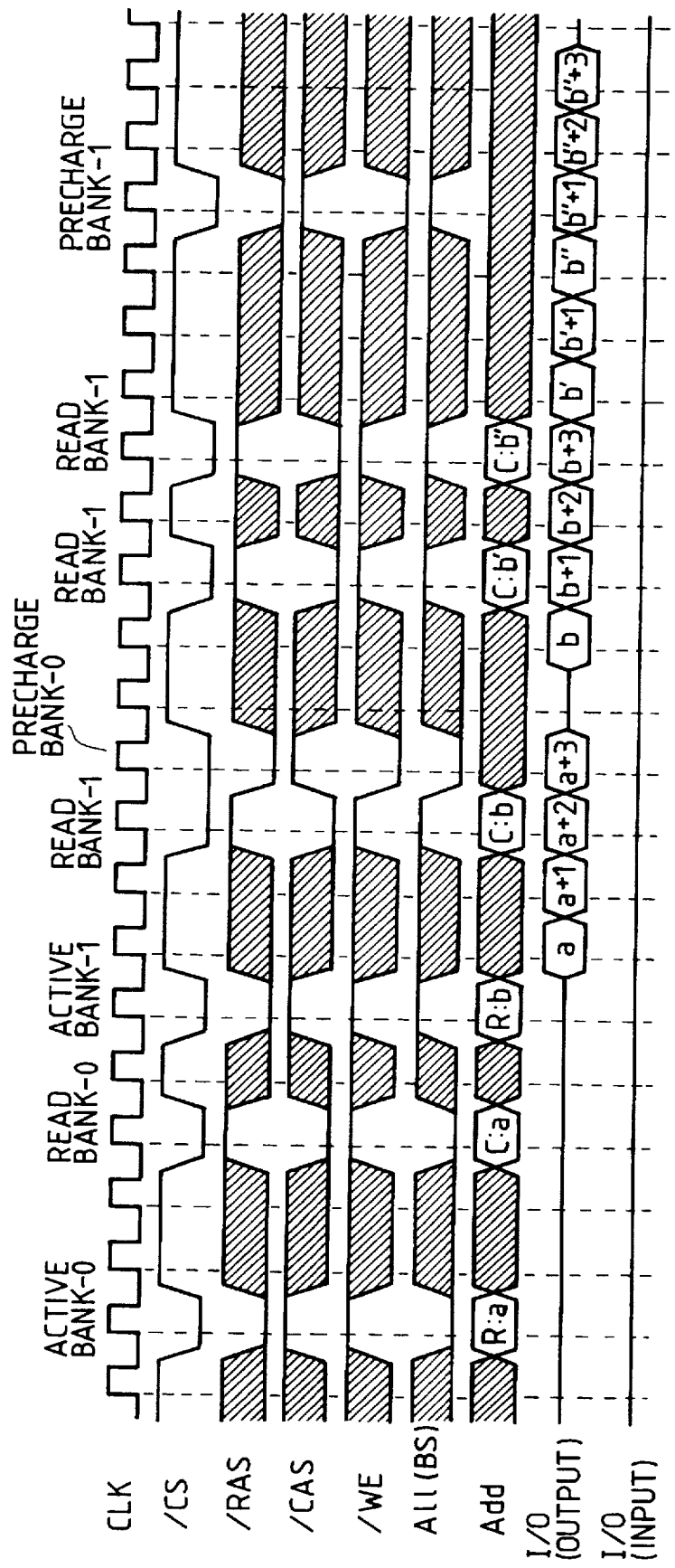
FIG. 12 is a timing chart for explaining a read cycle of the SDRAM according to the present invention.

FIG. 12 is a diagram of timings for explaining the read cycle of the SDRAM according to the present invention. A row address R:a is received due to /CS and /RAS of the low level. Due to the address A11 (bank select BS) of the low level, furthermore, the bank-0 is activated and the operation of selecting the row address is started for the bank-0. After 3 clock signals, /CAS is changed to the low level, whereby a column address C:a is received to start the operation for selecting column address.

When the CAS latency is designated to be 3, an output a is produced after 3 clock signals. When the burst read is designated, the data a+1, a+2 and a+3 are successively output in synchronism with the clock signals. In parallel with this read operation, the active bank-1 is designated, followed by the input of the corresponding row address R:b and a column address C:b which is delayed by three clock signals. After 3 clock signals, therefore, the data b, b+1, b+2 and b+3 are successively read out.

When a column address C:b' is input by designating a read bank-1, the data b' and b'+1 are output after 3 clock signals. When a column address c:b" is input by designating the read bank-1 after 2 clock signals, b' is replaced by b" and, hence, data b", b"+1, b"+2 and b"+3 are output 3 clock signals after the input.

Figure 13:
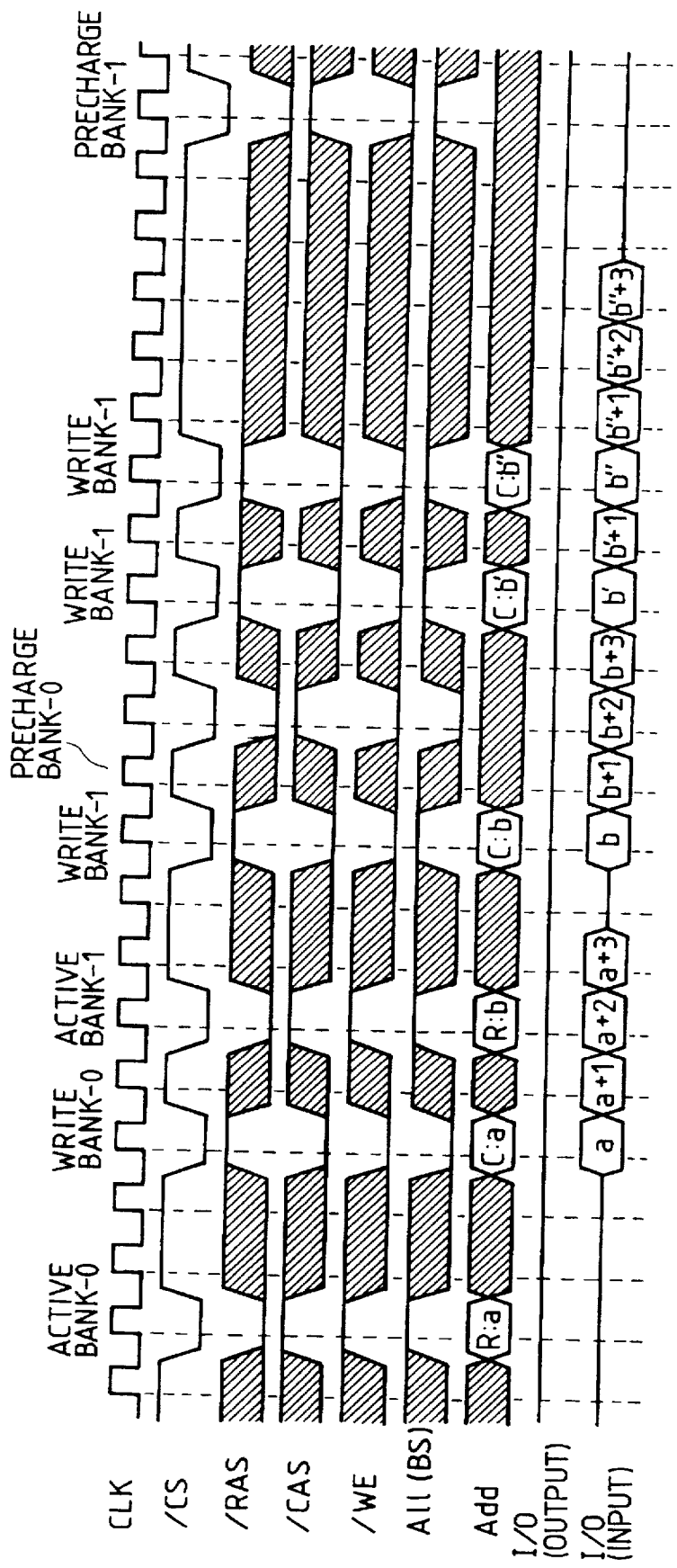
FIG. 13 is a timing chart for explaining a write cycle of the SDRAM according to the present invention.

FIG. 13 is a diagram of timings for explaining a write cycle of the SDRAM according to the present invention. The row address R:a is received due to /CS and /RAS of the low level. Due to the address A11 (bank select BS) of the low level, furthermore, the bank-0 is activated and the operation of selecting the row address is started for the bank-0. After 3 clock signals, /CAS is changed to the low level, whereby the column address C:a is received to start the operation of selecting column address. At the same time, a write signal a that has been simultaneously input is written into a memory cell that is selected. Thereafter, the column address is updated correspondingly to the burst write, and the data a+1, a+2 and a+3 are written in synchronism with the clock signals.

In parallel with the burst write operation, the active bank-1 is designated, the corresponding row address R:b is input, the column address C:b is input after 3 clock signals therefrom and the write data b is written. Similarly, thereafter, the data b+1, b+2 and b+3 are successively written in synchronism with the clock signals. Thereafter, the write bank-1 is designated, the column address C:b' is input, the write data b' and b'+1 are input, the read bank-1 is designated and the column address C:b" is input, whereby the column address b' is replaced by b". Therefore, the data b", b"+1, b"+2 and b"+3 corresponding thereto are successively written.

Figure 14A:
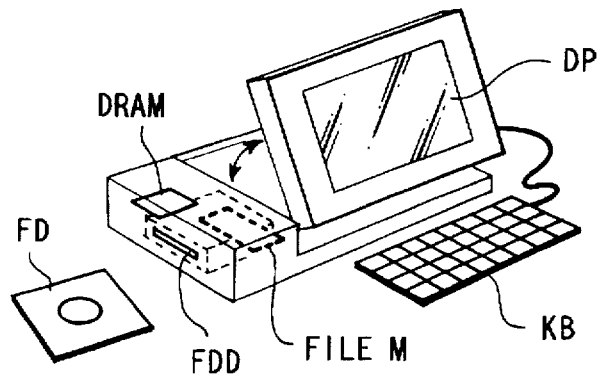
FIGS. 14(A) and 14(B) are diagrams illustrating the constitution of a personal computer system using a dynamic RAM to which the embodiment of the present invention is adapted.
Figure 14B:
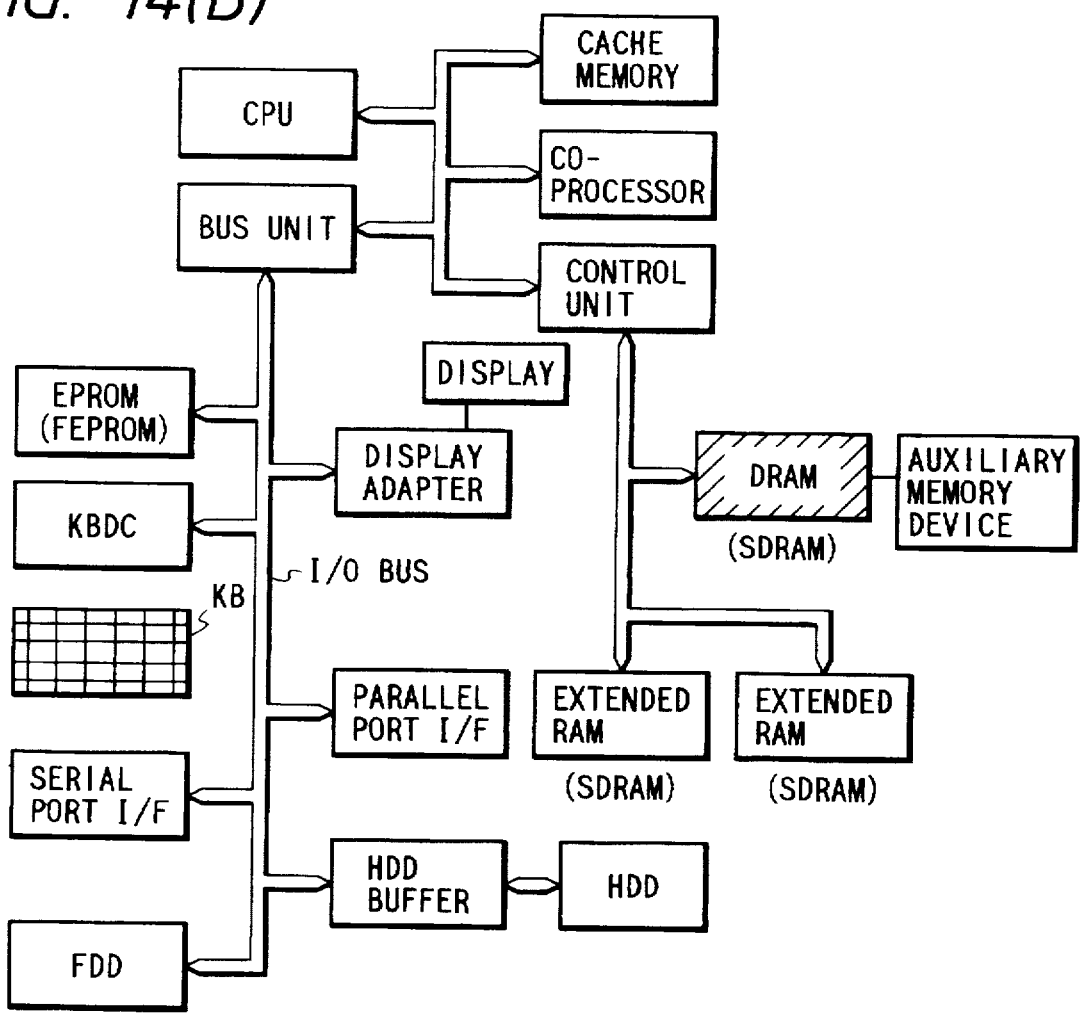

FIGS. 14(A) and 14(B) are diagrams illustrating the constitution of a personal computer system using a dynamic RAM to which is adapted the present invention, wherein FIG. 14(A) is a diagram schematically illustrating the appearance of major portions and FIG. 14(B) is a block diagram thereof.

The system incorporates a floppy disk drive FDD, a file memory file M made up of a DRAM to which the present invention is adapted and which serves as a main memory, and an SRAM which is backed up by a battery. The input/output devices are a keyboard KB and a display DP, and a floppy disk FD is inserted in the floppy disk drive FDD. Thus, there is set up a desk-top personal computer in which the floppy disk FD serves as a software and the file memory file M serves as a hardware storing the data therein.

The embodiment is an example in which the invention is adapted to the desk-top personal computer. It should, however, be noted that the invention can be also adapted to a note-type personal computer or the like, a floppy disk is used as an auxiliary function, but the invention is not limited to them.

Referring to FIG. 14(B), the personal computer of this embodiment is constituted by a central processing unit CPU as a main information device, an I/O bus constructed in the information processing system, a bus unit, a memory control unit for accessing a main memory and an extended memory at a high speed, a DRAM (SDRAM) according to the invention serving as the main memory and an extended RAM (SDRAM), an EPROM (flash EPROM) storing basic control program and the like, and a keyboard controller KBDC to the edge of which a keyboard is connected.

A display adapter is connected to the I/O bus, and a display is connected to the edge of the display adapter. To the I/O bus are connected a parallel port I/F, a serial port I/F such as a mouse or the like, a floppy disk drive FDD, and a buffer controller HDD BUFFER for conversion into HDD I/F from the I/O bus. Extended RAMs and the SDRAM of the invention serving as a main memory are connected to a bus from the memory control unit. Though there is no particular limitation, the extended RAMs are constituted by the SDRAM of the present invention.

The operation of the personal computer system will be briefly described. When the power source circuit is turned on to start the operation, the ROM is accessed by the central processing unit CPU through the I/O bus to execute the initial diagnosis and initial setting. Then, a system program is loaded from the auxiliary memory device into the DRAM of the present invention which serves as the main memory. The central processing unit CPU so operates that the HDD is accessed by the HDD controller via the I/O bus. After the system program is loaded, the processing is executed in compliance with the processing request by the user.

The user proceeds the operation while inputting and outputting the data using the keyboard controller KBDC and the display adapter on the I/O bus. As required, the user utilizes the input/output devices which is connected to the parallel port I/F and to the serial port I/F. When the memory capacity of the SDRAM of the present invention serving as the main memory is not sufficient, the main memory capacity is supplemented by the extended RAMs. Though the drawing illustrates a hard disk drive HDD, there may be used a flash file employing a flash memory FEPROM.

The above-mentioned embodiment has the following functions and effects.

(1) In the synchronous DRAM, internal clock signals in synchronism with the clock signals fed from an external unit are generated by the PLL circuit or the DLL circuit, and provision is made of a change-over circuit which changes the range of variable frequencies of the PLL circuit or the variable delay time of the DLL circuit based upon a mode setting information fed from an external unit. It is therefore possible to stably maintain the synchronism with the external clock signals even at high frequencies and to realize a wide range of operation frequencies even to low frequencies by changing over the range of operation.

(2) The change-over circuit changes the range of variable frequencies of the ring oscillator constituting the PLL circuit or changes the range of variable delay of the delay circuit constituting the DLL circuit. That is, by changing the number of stages of the unit inverter circuits, it is possible to ensure a broad range of operation frequencies as required by means of a simple constitution.

(3) The number of stages of the unit inverter circuits is automatically changed over by an internal circuit according to the CAS latency set by the mode register, enhancing the convenience of the device.

(4) The internal clock signals input to the phase comparator of the PLL circuit or the DLL circuit are lagged by a delay circuit which has a delay quantity corresponding to the input buffer that receives clock signals fed through an external terminal. Therefore, the delay of signals through the input buffer is canceled, and the clock signals fed to the external terminal and the internal clock signals are synchronized with each other.

The invention made by the present inventors has been described by way of an embodiment. However, it should be noted that the present invention is in no way limited to the above-mentioned embodiment only but can be modified in a variety of other ways without departing from the spirit and scope of the invention. For instance, a PLL circuit or a DLL circuit having a low operation frequency may be prepared to carry out operation using extremely slow clock signals compared with the ordinary operation frequency for developing and designing devices and for inspecting the products. Alternately, the operation of the PLL circuit or the DLL circuit may be halted in the testing mode, permitting the clock signals fed through the external terminal to pass through so as to use them as internal clock signals. Such a testing mode can be conveniently set by the mode register.

The present invention can be extensively utilized for dynamic RAMs such as synchronous DRAMs in which reception of input signals and transmission of output signals in synchronism with the clock signals fed through the external terminal and the corresponding operation timing of the internal circuit are controlled.

The effects brought about by a representative of the invention disclosed in this application. In a synchronous DRAM, internal clock signals in synchronism with the clock signals fed from an external unit are generated by a PLL circuit or a DLL circuit, and provision is made of a change-over circuit which changes the range of variable frequencies of the PLL circuit or the variable delay time of the DLL circuit based upon a mode setting information fed from an external unit. It is therefore possible to stably maintain the synchronism with the external clock signals even at high frequencies and to realize a wide range of operation frequencies even to low frequencies by changing over the range of operation.

The change-over circuit changes the range of variable frequencies of the ring oscillator constituting the PLL circuit or changes the range of variable delay of the delay circuit constituting the DLL circuit. That is, by changing the number of stages of the unit inverter circuits, it is possible to ensure a broad range of operation frequencies as required by means of a simple constitution.

The number of stages of the unit inverter circuits is automatically changed over by an internal circuit according to the CAS latency set by the mode register, enhancing the convenience of the device.

The internal clock signals input to the phase comparator of the PLL circuit or the DLL circuit are lagged by a delay circuit which has a delay quantity corresponding to the input buffer that receives clock signals fed through an external terminal. Therefore, the delay to signals through the input buffer is canceled, and the clock signals fed to the external terminal and the internal clock signals are accurately synchronized with each other.

What is claimed is:

1. A dynamic memory device formed on a semiconductor substrate and having a clock signal input circuit for generating internal clock signals to operate the dynamic memory device, wherein said clock signal input circuit comprises:

(1) a first input terminal for receiving external clock signals fed from outside of said dynamic memory device;

(2) a first output terminal for outputting internal clock signals;

(3) a delay circuit having a second input terminal connected to said first output terminal and a second output terminal, said delay circuit delaying signals inputted to said second input terminal and outputting them to said second output terminal;

(4) a comparator circuit having a third input terminal connected to said first input terminal and a fourth input terminal connected to said second output terminal, said comparator circuit detecting the difference between the timing at which the signal inputted to said third input terminal changes and the timing at which the signal inputted to said fourth input terminal changes, and outputting a detection signal that corresponds to said difference in the timing of change;

(5) an oscillation circuit having a third output terminal connected to said first output terminal and outputting oscillation signals to said first output terminal;

(6) a control circuit, coupled to receive said detection signal from said comparator circuit and having an output coupled to said oscillation circuit, for changing the oscillation frequency of said oscillation signals according to said detection signal, wherein said oscillation circuit has a first group of n inverters that are connected together like a ring and a second group of m inverters that are connected together like a ring; and a selection circuit for selecting said first group of inverters when the frequency of said external clock signals lies within a first range, and for selecting said second group of inverters when the frequency of said external clock signals lies within a second range, wherein the frequencies in said first range are higher than the frequencies in said second range, wherein said number n is an odd number, the number m is an odd number different from n, and said first range is different from said second range.

2. A dynamic memory device comprising:

a PLL circuit comprising a phase comparator which compares clock signals fed through an external terminal with internal clock signals, a loop filter which converts the output signals of the phase comparator into a direct current, a ring oscillator for generating said internal clock signals, wherein a signal delay quantity of a unit inverter circuit of said ring oscillator for generating said internal clock signal is controlled by a control voltage generated by the loop filter, and a change-over circuit which changes a range of variable frequencies of said ring oscillator by selecting different numbers of inverter stages within said unit inverter circuit based upon mode setting information fed from an external unit; and an input/output interface in which at least the input of address signals, control signals and write signals and the output of read signals are controlled in synchronism with said internal clock signals.

3. A dynamic memory device according to claim 2, wherein the number of stages of said unit inverter circuits is automatically changed by an internal circuit according to a CAS (column address strobe signal) latency set by a mode register.

4. A dynamic memory device according to claim 3, wherein the internal clock signals input to said phase comparator are lagged by the delay circuit having a delay quantity which corresponds to an input buffer that receives clock signals fed through an external terminal.

5. A dynamic memory device comprising:

a DLL circuit comprising a phase comparator which compares external clock signals fed through an external terminal with internal clock signals, a loop filter which converts the output signals of the phase comparator into a direct current, a delay circuit for generating said internal clock signals having the same frequency as said external clock signals but having delay relative to the external clock signals, wherein said delay is caused by a unit inverter circuit in said delay circuit, wherein a signal delay quantity of said unit inverter circuit is controlled by a control voltage generated by the loop filter, and a change-over circuit which changes a range of variable delay of said delay circuit by selecting different numbers of inverter stages within said unit inverter circuit based upon mode setting information fed from an external unit; and an input/output interface in which at least the input of address signals, control signals and write signals and the output of read signals are controlled in synchronism with said internal clock signals.

* * * * *